United States Patent [19]

Kupfer

[11] Patent Number: 4,710,974
[45] Date of Patent: Dec. 1, 1987

[54] CIRCUIT ARRANGEMENT FOR A TUNER FOR CHANGING OVER SEVERAL FREQUENCY RANGES

[75] Inventor: Karl-Heinz Kupfer, Krefeld, Fed. Rep. of Germany

[73] Assignee: U.S. Philips Corporation, New York, N.Y.

[21] Appl. No.: 835,124

[22] Filed: Feb. 28, 1986

[30] Foreign Application Priority Data

Mar. 6, 1985 [DE] Fed. Rep. of Germany ....... 3507865

[51] Int. Cl.$^4$ .............................................. H04B 1/26
[52] U.S. Cl. .................................... 455/190; 455/330
[58] Field of Search ....................... 455/180, 188–191, 455/330; 334/15

[56] References Cited

U.S. PATENT DOCUMENTS

| 4,363,135 | 12/1982 | Moon | 455/188 |
| 4,419,768 | 12/1983 | Yamashita et al. | 455/189 |
| 4,555,809 | 11/1985 | Carlson | 455/190 |
| 4,573,211 | 2/1986 | Kupfer | 455/180 |
| 4,590,612 | 5/1986 | Ijichi | 455/190 |
| 4,596,045 | 6/1986 | Maier | 455/189 |

*Primary Examiner*—Jin F. Ng
*Attorney, Agent, or Firm*—Thomas A. Briody; William J. Streeter; Gregory P. Gadson

[57] ABSTRACT

The disclosed invention relates to a circuit arrangement for a tuner, particularly a television tuner, for changing over several frequency ranges filtered out by bandpass filters, particularly the hyperband and UHF band, by means of diodes connected to a common IF circuit which also serve as mixer diodes for mixing signals passed by the bandpass filters with signals generated by associated RF oscillators. The desired frequency range is switched on by switching on the associated RF oscillator so that the otherwise cut-off diode of this frequency range becomes periodically conducting.

8 Claims, 2 Drawing Figures

4,710,974

CIRCUIT ARRANGEMENT FOR A TUNER FOR CHANGING OVER SEVERAL FREQUENCY RANGES

BACKGROUND OF THE INVENTION

1. Field of the Invention

The invention relates to a circuit arrangement for a tuner, particularly a television tuner, for changing over several frequency ranges filtered out by bandpass filters, particularly the hyperband (160–430 mHz) and UHF band frequency ranges, by means of diodes which also serve as mixer diodes for IF mixing and which are connected to a common IF circuit.

2. Brief Description of the Prior Art

A circuit arrangement of this type is known from German Patent Specification No. 2927225. In this specification an IF oscillator and an IF mixer diode are associated with each frequency range. An IF circuit connected to an input of an IF amplifier is arranged behind each IF mixer diode. Consequently two inputs of an RF amplifier IC are required, for example, for the hyperband and the UHF band. The change-over between hyperband and UHF band is effected in that a circuit arrangement having a switching diode is arranged in each of the two frequency ranges which switching diode is switched with the aid of a direct voltage to be applied externally. In this manner a change-over between the frequency ranges can be effected.

SUMMARY OF THE INVENTION

It is an object of the invention to simplify such a circuit arrangement for changing over several frequency ranges and for IF mixing and thus rendering its manufacture more economical.

According to the invention this object is solved in that the circuit arrangement comprises an RF oscillator which can be switched on and off for each of the frequency ranges and that the desired frequency range is switched on by switching on its associated RF oscillated so that the otherwise cut-off mixer diode of this frequency range becomes periodically conducting with the oscillator frequency.

Such a circuit arrangement thus has a mixer diode for each frequency range, which diode simultaneously has a switching function. If the oscillator associated with the frequency range is switched off, then the diode is cut off and if it is switched on, the diode is periodically conducting and operating as a mixer diode. A common IF circuit whose output is connected, for example, to an input of an IF amplifier IC is arranged behind the diodes. This circuit arrangement thus economizes on two switching diodes with the associated resistors and capacitors.

An embodiment of the invention will be described in greater detail with reference to the drawings.

DETAILED DESCRIPTION OF THE PREFERRED EMBODIMENT

Figure 1:
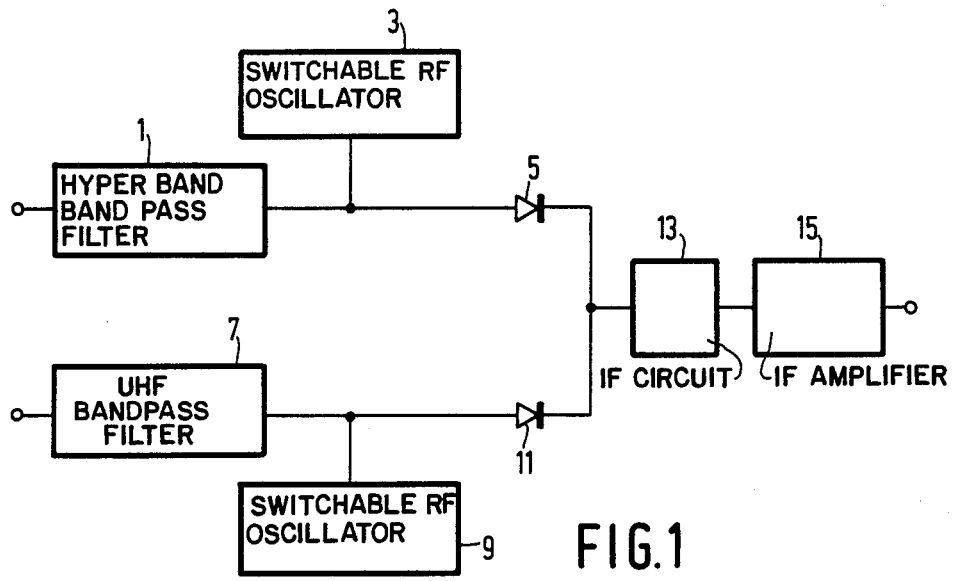
FIG. 1 is a block diagram of a circuit arrangement for changing over and mixing the hyperband (160–430 mHz) and UHF band frequency ranges.

The block diagram of FIG. 1 shows a bandpass filter for the hyperband (160–430 mHz) 1 and a switchable RF oscillator for the hyperband 3 whose outputs are connected to the anode of a mixer diode 5. In the UHF range the corresponding bandpass filter 7, the switchable RF oscillator 9 and the mixer diode 11 are arranged similarly. The cathodes of the mixer diodes 5 and 11 are connected to a common IF circuit 13 whose output is connected to the input of an IF amplifier 15, for example, an IF amplifier IC.

Figure 2:
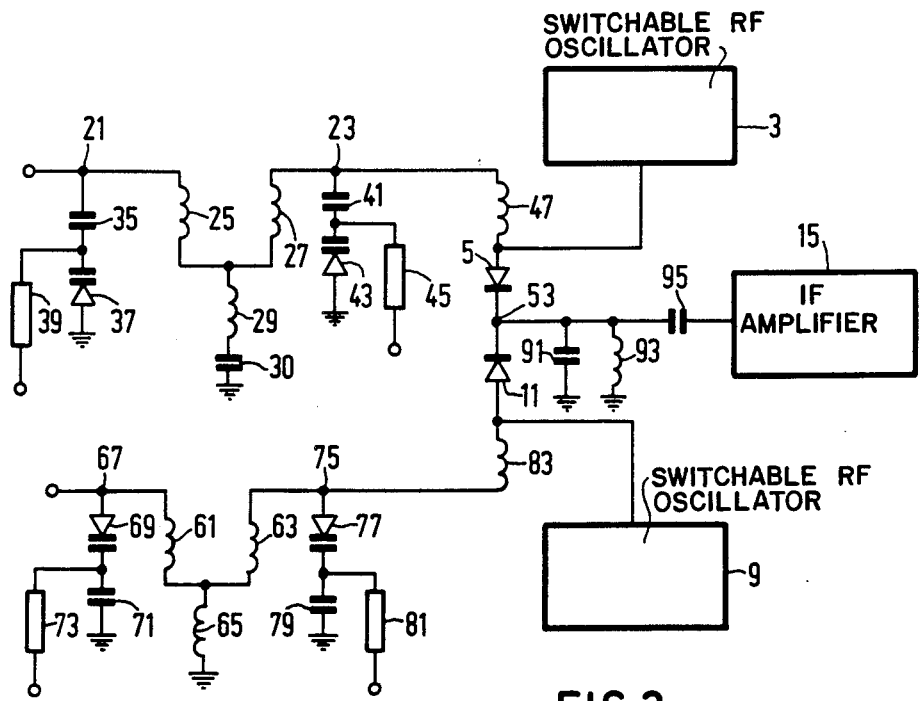
FIG. 2 shows a circuit diagram of an embodiment of a circuit arrangement for changing over and mixing the hyperband and UHF band frequency ranges according to FIG. 1.

The circuit diagram at the top of FIG. 2 shows a known bandpass filter for the hyperband frequency range. The inductances 25 and 27 are arranged in series between the input 21 and the output 23 of the bandpass filter and the inductance 29 and the capacitor 30 are series connected to ground from the junction between these two inductances. This bandpass filter is tuned by capacitance diodes 37, 43 arranged at the input and the output. To this end the anode of the capacitance diode 37 is connected to ground at the input via the capacitor 35. The tuning voltage is applied via a resistor 39 to the cathode of the diode 37. A capacitor 41, the capacitance diode 43 and a resistor 45 are arranged similarly at the output of the bandpass filter. The signal at the output 23 of the hyperbandfilter reaches the anode of a mixer diode 5 via a coupling coil 47. The output of a switchable RF oscillator 3 (not shown in detail) for the hyperband is also connected to the anode of the mixer diode 5. The cathode of the mixer diode 5 is connected to a point 53. The UHF bandpass filter comprising the inductances 61, 63 and 65 has the same construction as that of the hyperbandpass filter, but without a capacitor. A tuner at the input 67 of the UHF bandpass filter is provided with a capacitance diode 69 whose cathode is connected to the input 67 of the bandpass filter and whose cathode is connected to ground via a capacitor 71. The tuning voltage is applied via a resistor 73 to the cathode of the capacitance diode 69. The output 75 of the UHF bandpass filter has a second tuner in which a capacitance diode 77, a capacitor 79 and a resistor 81 are disposed in the same manner as in the tuner at the input of the UHF filter. The output 75 of the UHF bandpass filter is connected via a coupling coil 83 to the cathode of a mixer diode 11 which, analogous to the hyperband part, is connected to the output of a UHF-RF oscillator 9. Likewise as the cathode of the mixer diode 5 in the hyperband part, the cathode of the mixer diode 11 is connected to the point 53. Furthermore said point 53 is connected to an IF circuit comprising a capacitor 91 connected to ground and an inductance 93 likewise connected to ground. The point 53 is connected via a capacitor 95 to a subsequent IF amplifier 15 which may be, for example, an IF amplifier IC.

This circuit arrangement operates as follows: The cut-off voltage of the mixer diodes 5 and 11 is not exceeded when the relevant RF oscillators 3 and 9, respectively, are switched off, that is to say, the mixer diodes are cut off and do not realize a through-connection of the relevant frequency band to the point 53 and hence to the IF circuit. A periodical through-connection of the relevant mixer diode 5 or 11 is not effected until the relevant oscillator 8 or 9 is switched on and hence the switching voltage of the diode 5 or 11 is exceeded periodically with the oscillator frequency by the oscillator signal. The capacitor 91 of the IF circuit is also used to shunt higher frequencies to ground, which may not have been filtered out by primary bandpass filters (not shown) and thus ensures that the mixer diode 5 or 11 is cut off when the relevant RF oscillator 3 or 9 is not switched on.

The change-over between the hyperband and the UHF frequency band is thus effected in the circuit arrangement with the aid of the diodes 5 and 11 which have both a mixing and a switching function, by switching on the RF oscillator 3 or 9 associated with each frequency range.

What is claimed is:

1. A television tuner circuit, comprising:
  (a) first tunable filter means having an input and an output, for receiving first signals at said input, for filtering said signals, and for passing desired signals within a first frequency range to said output;
  (b) first switchable RF oscillator means for providing a signal which when mixed with said passed signal of said first tunable filter means will result in an IF signal, said first switchable RF oscillator means including an output coupled to the output of said first tunable filter means, and means for switching said RF oscillator means on and off;
  (c) first diode means having an anode input and a cathode output, with the anode of said first diode means connected to the coupled output of said first tunable filter means and said first switchable RF oscillator means, wherein when said first switchable RF oscillator means is switched on by said switching means, said first diode mixes said signals output by said first tunable filter means and said first switchable RF oscillator means to periodically provide an IF signal at the output cathode, and wherein when said first switchable RF oscillator means is switched off by said switching means, said first diode means cuts off the signals passed by said first tunable filter;
  (d) second tunable filter means having an input and output, for receiving second signals at its input, for filtering said signals, and for passing desired signals within a second frequency range to its output;
  (e) second switchable RF oscillator means for providing a signal which when mixed with said passed signals of said second tunable filter means will result in an IF signal, said second switchable RF oscillator means including an output coupled to the output of said second tunable filter means, and second means for switching said second switchable RF oscillator means on and off;
  (f) second diode means having an anode input and a cathode output connected to the cathode of said first diode means, with the anode of said second diode means connected to the coupled output of said second tunable filter means and said second switchable RF oscillator means, wherein when said second switchable RF oscillator means is switched on by said second switching means, said second diode mixes said signals output by said second tunable filter means and said second switchable RF oscillator means to periodically provide an IF signal at the output cathode, and wherein when said second switchable RF oscillator means is switched off by said second switching means, said second diode means cuts off the signals passed by said second tunable filter; and
  (g) a common IF circuit means having an input connected to the outputs of said first and second diode means.

2. A television tuner circuit according to claim 1, wherein:
  said first signals received by said first tunable filter means are primarily hyperband frequency signals and said first switchable RF oscillator means is a switchable RF oscillator for hyperband frequencies; and
  said second signals received by said second tunable filter means are primarily UHF signals and said second switchable RF oscillator means is a switchable RF oscillator for UHF frequencies.

3. A television tuner circuit according to claim 1, wherein:
  said first and second tunable filter means each comprise a bandpass filter means, and
  two capacitance diode tuner means, one each at the input and output of said bandpass filter means.

4. A television tuner circuit according to claim 3, wherein:
  said first tunable filter means is coupled to said first switchable RF oscillator means by a first inductor means; and
  said second tunable filter means is coupled to said second switchable RF oscillator means by a second inductor means.

5. A television tuner circuit according to claim 4, wherein:
  said common IF circuit means comprises
  a first capacitor and third inductor means connected from the output cathodes of said first and second diode means to ground, and
  a second capacitor connected in series with the output cathodes of said first and second diode means.

6. A television tuner circuit according to claim 5, wherein said common IF circuit means has an output, further comprising:
  (h) IF amplifier means having an input connected to the output of said common IF circuit means.

7. A television tuner circuit according to claim 6, wherein:
  said first signals received by said first tunable filter means are primarily hyperband frequency signals and said first switchable RF oscillator means is a switchable RF oscillator for hyperband frequencies; and
  said second signals received by said second tunable filter means are primarily UHF signals and said second switchable RF oscillator means is a switchable RF oscillator for UHF frequencies.

8. A television tuner circuit according to claim 1, wherein said common IF circuit means has an output, further comprising:
  (h) IF amplifier means having an input connected to the output of said common IF circuit means.

* * * * *